US008972652B2

(12) United States Patent
Kim et al.

(10) Patent No.: US 8,972,652 B2
(45) Date of Patent: Mar. 3, 2015

(54) DATA REFRESH IN NON-VOLATILE MEMORY

(71) Applicant: Spansion LLC, Sunnyvale, CA (US)

(72) Inventors: Yong K. Kim, Santa Clara, CA (US);
Keith H. Wong, San Jose, CA (US);
Mark A. McClain, San Diego, CA (US)

(73) Assignee: Spansion LLC, Sunnyvale, CA (US)

( * ) Notice: Subject to any disclaimer, the term of this patent is extended or adjusted under 35 U.S.C. 154(b) by 172 days.

(21) Appl. No.: 13/680,507

(22) Filed: Nov. 19, 2012

(65) Prior Publication Data

US 2014/0143473 A1    May 22, 2014

(51) Int. Cl.
*G06F 12/00* (2006.01)
*G11C 16/10* (2006.01)
*G11C 16/34* (2006.01)
*G11C 16/02* (2006.01)
*G11C 16/16* (2006.01)

(52) U.S. Cl.
CPC ............ *G11C 16/10* (2013.01); *G11C 16/3418* (2013.01); *G11C 16/02* (2013.01); *G11C 16/16* (2013.01)
USPC .......................................... 711/103; 711/106

(58) Field of Classification Search
CPC . G06F 12/0246; G11C 16/02; G11C 16/3418
USPC ................................ 711/103, 106
See application file for complete search history.

(56) References Cited

U.S. PATENT DOCUMENTS

| 7,010,644 | B2 | 3/2006 | Gilton |
| 7,936,610 | B1 | 5/2011 | Melcher et al. |
| 8,161,355 | B2 * | 4/2012 | Fung et al. .................... 714/763 |
| 2007/0258306 | A1 | 11/2007 | Riekels et al. |
| 2008/0151669 | A1 * | 6/2008 | Bill et al. ...................... 365/222 |
| 2009/0161466 | A1 * | 6/2009 | Hamilton et al. ............. 365/222 |
| 2011/0093671 | A1 * | 4/2011 | Swaminathan ............... 711/156 |

OTHER PUBLICATIONS

International Search Report and Written Opinion of the International Searching Authority for International Application No. PCT/US2013/070561, mailed Feb. 21, 2014.

* cited by examiner

*Primary Examiner* — Than Nguyen
(74) *Attorney, Agent, or Firm* — Sterne, Kessler, Goldstein & Fox PLLC (57) ABSTRACT

A method of reducing read errors in a non-volatile memory device that result from bit-line or word-line disturb conditions generated by erase operations includes selecting a subset of a memory array for refresh after each erase operation. A pointer to the refresh target section is updated as part of the method to direct the refresh operation to the appropriate subset of the memory array. Refresh may be performed subsequent to an erase operation or concurrently therewith. By distributing the time consumed by refresh operations over many erase operations so the relative refresh time for any one erase becomes small.

20 Claims, 7 Drawing Sheets

FIG. 1

FIG. 2
Erase/Tunnelling

FIG. 3
Program/Injection

FIG. 4
Read/Unintended Injection

FIG. 5
Unaccessed Device Sharing Word Line or Bit Line with Erase Sector

DATA REFRESH IN NON-VOLATILE MEMORY

FIELD OF THE INVENTION

The present invention relates generally to non-volatile memory, and more particularly relates to refreshing the content of non-volatile memory cells.

BACKGROUND

Advances in semiconductor manufacturing processes, digital system architecture, and wireless infrastructure, among other things, have resulted in a vast array of electronic products, particularly consumer products, that drive demand for ever-increasing performance and density in non-volatile memory.

One means of increasing the performance and density of non-volatile memories such as flash memory, is to shrink the dimensions of floating gate transistors that are used in flash memories. It is well-recognized that shrinking the physical dimensions of the floating gate transistor also reduces the size of the floating gate itself and thus reduces the amount of charge that can be stored. When less charge storage is available, the memory cell becomes more sensitive to memory operations that unintentionally inject or remove charge, and thereby degrade the ability to store data successfully over many operational cycles. Mechanisms, other than erasing and programming, that affect the amount of charge stored on the floating gate of a flash memory cell include word line disturb error and bit line disturb error.

Word line and bit line disturb errors are similar to each other in that the voltages that appear across the terminals of a flash memory cell, i.e., across the terminals of a floating gate transistor, are such that electrons are caused to tunnel out of the floating gate, and typically into the drain. This unintended electron tunneling causes a shift in the threshold voltage of the floating gate transistor, and consequently may change the data previously stored. This data degradation phenomenon occurs in a memory cell that has not been selected, but which shares a word-line and/or bit-line with one or more memory cells that have been selected for an erase operation.

In order to overcome the loss of data integrity caused by these unintended increases or decreases in stored charge, refresh operations have been used in flash memories. Refresh operations read out data from a section of the flash memory array and re-program the corresponding memory cells with the same data.

Various schemes for refreshing the content of flash memory cells that are affected by word-line or bit-line disturb errors have been implemented in the past. Unfortunately, conventional refresh schemes that refresh all potentially affected memory cells at the same time, consume undesirable amounts of time and resources.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

It is noted that the cross-sectional representations of various semiconductor structures shown in the figures are not necessarily drawn to scale, but rather, as is the practice in this field, drawn to promote a clear understanding of the structures, process steps, and operations which they are illustrating.

DETAILED DESCRIPTION

The following Detailed Description refers to accompanying drawings to illustrate exemplary embodiments consistent with the invention. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Terminology

The terms, chip, die, integrated circuit, semiconductor device, and microelectronic device, are often used interchangeably in the field of electronics. The present invention is applicable to all the above as these terms are generally understood in the field.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants or combinations. Although connections between and amongst chips are commonly made by way of electrical conductors, those skilled in the art will appreciate that chips and other circuit elements may alternatively be coupled by way of optical, mechanical, magnetic, electrostatic, and electromagnetic interfaces.

FET, as used herein, refers to a metal-oxide-semiconductor field effect transistor (MOSFET). An n-channel FET is referred to herein as an NFET. A p-channel FET is referred to herein as a PFET.

Floating gate transistor refers to a FET in which a stack is disposed over the channel region, where that stack has a first dielectric layer disposed over the channel region of the FET, a first charge storage material disposed over the first dielectric layer, a second dielectric layer disposed over the electrically conductive material, and a second electrically conductive material disposed over the second dielectric layer. The first dielectric layer is referred to herein as the floating gate dielectric layer. Historically, and less accurately, the first dielectric layer was referred to as the tunnel oxide. The first charge storage material is referred to as the floating or charge trapping gate. The second dielectric layer is referred to herein as the control gate dielectric layer. Historically, the second dielectric layer was referred to as the interpoly oxide, but this term is misleading for floating gate transistors having a high-k dielectric material as the second dielectric layer, and a control gate made of metal, metal alloy, or a stack of metals or metal alloys (HKMG). The second electrically conductive material is referred to as the control gate. In this arrangement the floating gate is electrically insulated from any other electrical node.

Source/drain (S/D) terminals refer to the terminals of a FET, between which conduction occurs under the influence of an electric field, subsequent to the inversion of the semiconductor surface (i.e., the semiconductor surface disposed adjacent to the gate dielectric layer of the FET) under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

High-k dielectric refers to a material that has a dielectric constant greater than that of silicon dioxide.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The expression "refresh unit" refers to the number of memory cells that are refreshed by a refresh operation. The refresh unit may be described in terms of logical segments of a memory such as but not limited to a sector or a block.

Overview

A flash memory cell is a non-volatile memory cell that is typically formed from a floating gate transistor. Flash memory products generally include an array of flash memory cells. It is noted that the term array is not used to limit the invention in any way, but rather to convey that a plurality of flash memory cells are typically arranged into one or more logical groupings within a flash memory product.

Alternative non-volatile memory cells, such as those that trap charge within the gate dielectric layer, rather than on a floating gate, may also be used to produce flash memory products. The present invention is applicable to both memory products without regard to whether charge trapping transistors and floating gate transistors are used to implement the flash memory products.

In the flash memory it is common for a portion of the floating gate transistors in the array to be interconnected such that their control gates form a common node. That common node is referred to as a word-line. The word line is driven by a word-line driver circuit, which may apply a voltage to the control gates, that voltage having a magnitude dependent on whether these memory cells have been addressed, and on whether an erase, program, or read operation is to be performed. Flash memory arrays typically include many word-lines.

Similarly, in the flash memory array it is common for a portion of the floating gate transistors in the array to be interconnected such that their drains form a common node. This common node is referred to as a bit-line. A bit-line driver circuit may apply a voltage to the bit-line, that voltage having a magnitude dependent on whether a memory cell connected to the bit-line has been addressed, and on whether an erase, program, or read operation is to be performed. Flash memory arrays typically include many bit-lines.

In addressing, i.e., selecting, portions of a flash memory array, it is known that accessing the desired memory cell(s) can unintentionally place electrons on, or remove electrons from, the floating gate of non-selected memory cells, if those non-selected memory cells share a word-line and/or a bit-line with the selected memory cells. Adding or removing electrons will change the threshold voltage of the transistor of the memory cell, thus possibly moving the threshold voltage away from its targeted value.

In one particular example, during an erase operation, a selected set of memory cells are erased, and a neighboring set of memory cells that share a bit-line suffer from a loss of electrons that were previously stored on the floating gates of those neighboring (i.e., bit-line sharing) memory cells. It is noted that a disturb can also happen during programming. In another example an erase algorithm, or process, may include a pre-programming operation such that, before the actual erase operation occurs, a programming operation is performed to place all selected memory cells in the programmed state before starting the erase operation. Both the programming operation and the erase operation can cause disturb in a neighboring set of memory cells.

A conventional approach to overcoming this undesired phenomenon is to perform a refresh operation. Unfortunately, conventional refresh operations can slow down the flash erase process. As explained in greater detail below, various embodiments of the present invention provide circuits and methods for reducing the amount of overhead associated with refreshing flash memory cells. Various embodiments advantageously maintain the integrity of data stored in the memory cells by directing the performance of refresh operations in an efficient manner.

Figure 1:
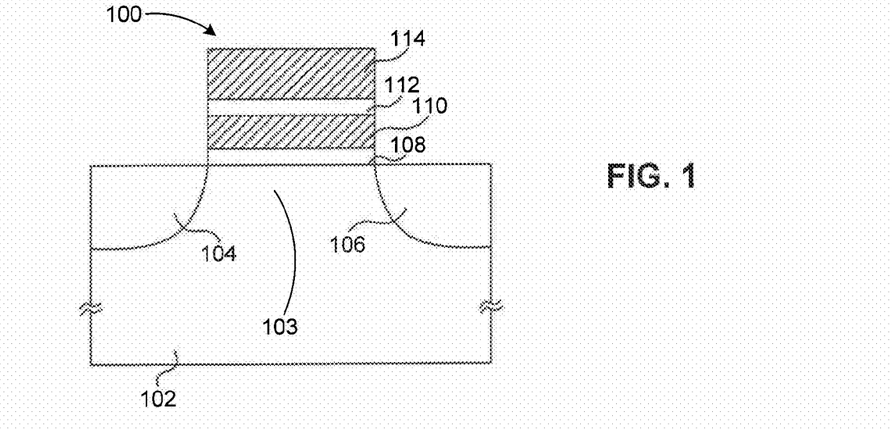
FIG. 1 is a cross-sectional representation of an n-channel floating gate field effect transistor used in a non-volatile memory array such as flash memory.

FIG. 1 shows a cross-sectional representation of an illustrative n-channel floating gate field effect transistor 100 used in a non-volatile memory array such as a flash memory. A substrate 102, typically, but not limited to, a silicon wafer, has formed therein a pair of source/drain (S/D) terminals 104, 106. That portion of substrate 102 laterally disposed between source 104 and drain 106 is referred to herein as a channel region 103. As can be seen in FIG. 1, source 104 and drain 106 are aligned to a stack that includes a gate dielectric layer 108, a floating gate 110, a dielectric layer 112, and a control gate 114. Floating gate 110 is electrically insulated from channel region 103 by gate dielectric layer 108, and is electrically insulated from control gate 114 by dielectric layer 112. In describing the operation of floating gate transistor 100, S/D terminal 104 is designated to be source terminal 104, and S/D terminal 106 is designated to be drain terminal 106. The threshold voltage of floating gate transistor 100 can be modified by increasing or decreasing the amount of charge stored on floating gate 110. Electrons are typically placed on the floating gate by hot electron injection, and removed by tunneling. By convention, removing electrons is referred to as erasing, and adding electrons is referred to as programming. Those skilled in the art will recognize that FIG. 1 is illustrative only, and that other device structures that implement the functionality of the illustrated floating gate transistor are possible. By way of example, and not limitation, the control gate may wrap around the vertical sides of the floating gate, with both gates separated by a dielectric material. By way of further example, and not limitation, dielectric layer 112 and control gate 114 may be comprised respectively of a high-k dielectric material and a metal, metal alloy, or stack of metals and/or metal alloys.

Figure 2:
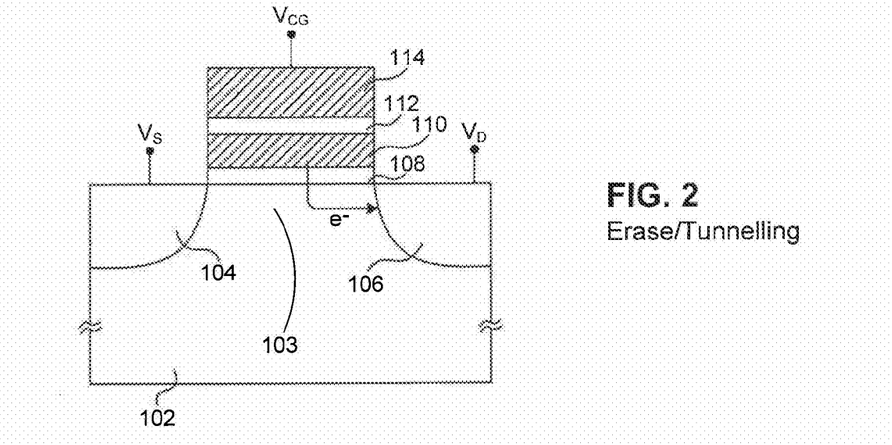
FIG. 2 shows the structure of FIG. 1 during an erase operation in which electrons tunnel from the floating gate to the drain.

FIG. 2 shows the structure of FIG. 1 during an illustrative erase operation in which electrons tunnel from the floating gate to the drain. In this example, to erase floating gate transistor 100, source terminal 104 is floated, i.e., isolated from all voltage sources, a voltage source $V_{CG}$ is applied to control gate 114, and a voltage source $V_D$ is applied to drain 106 such that a voltage difference of a predetermined magnitude is obtained between $V_{CG}$ and $V_D$. The applied voltages are such that the control gate is not attracting electrons and the drain is attracting electrons. This arrangement causes electrons stored on floating gate 110 to tunnel through floating gate dielectric 108, thereby reducing the amount of negative charge on floating gate 110, which in turn makes the threshold voltage of floating gate transistor 100 lower, i.e., able to turn on at a lower control-gate-to-source voltage.

It is noted that in alternative arrangements, the voltage in the channel region of the floating gate transistor, and/or the voltage in the well of the floating gate transistor, can also affect the erase operation. The present invention is not limited to any particular set of voltages or the application of those voltages on specific terminals of the floating gate transistors. Rather, the application of voltage differences between various terminals in any suitable combination to perform the desired erase, program, and refresh operations are contemplated.

Figure 3:
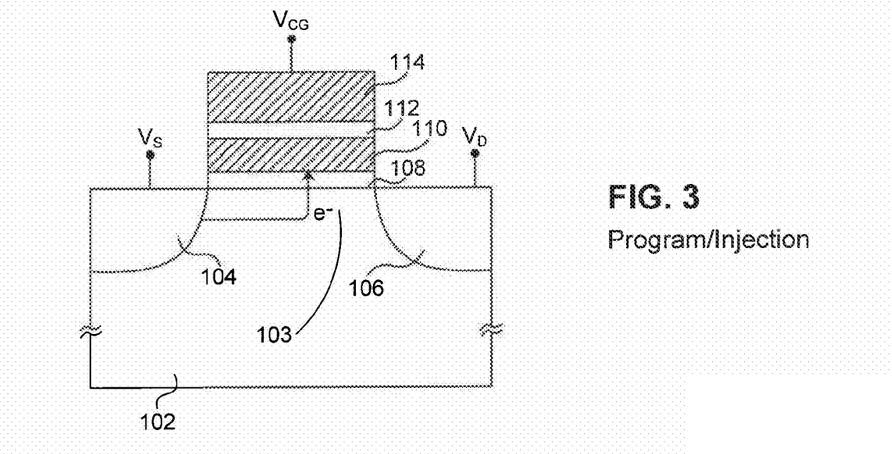
FIG. 3 shows the structure of FIG. 1 during a program operation in which electrons are injected onto the floating gate.

FIG. 3 shows the structure of FIG. 1 during a program operation in which electrons are injected onto the floating gate. To program floating gate transistor 100, a voltage source Vs is applied to source terminal 104, voltage source $V_{CG}$ is applied to control gate 114, and voltage source $V_D$ is applied to drain 106 such that both the control-gate-to-source voltage and the drain-to-source voltages are predetermined positive values. This arrangement causes electrons to be accelerated in channel region 103 between source 104 and drain 106 under the influence of the drain-to-source electric field. The accelerated electrons become sufficiently energetic that some of them have enough energy, after a collision with one or more atoms in the crystal lattice of channel region 103, to pass through floating gate dielectric layer 108 and become trapped in floating gate 110. The increased amount of negative charge on floating gate 110 makes the threshold voltage of floating gate transistor 100 higher, i.e., requiring a higher control-gate-to-source voltage to turn on.

Figure 4:
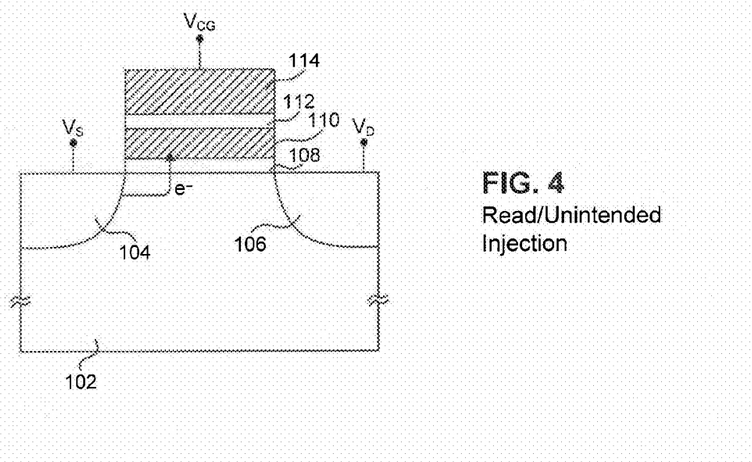
FIG. 4 shows the structure of FIG. 1 during a read operation in which some electrons are unintentionally injected onto the floating gate, in a process referred to as read disturb.

FIG. 4 shows the structure of FIG. 1 during a read operation in which some electrons are unintentionally injected onto the floating gate, in a process referred to as read disturb. In this example, to perform a read operation, floating gate transistor 100 is configured similarly to the programming operation shown in FIG. 3, except that the magnitude of the voltages applied to control gate 114 and drain 106 are both less than those applied during programming. Even though the voltages are significantly lower during a read operation than during a program operation, it is still possible for some electrons to obtain sufficient energy to be injected through floating gate dielectric 108 and into floating gate 110. This unintended charge injection increases the threshold voltage of floating gate transistor 100, and over some number of read operations this process can inject enough charge to change the state of the memory cell. This effect is sometimes referred to as a read disturb error.

Figure 5:
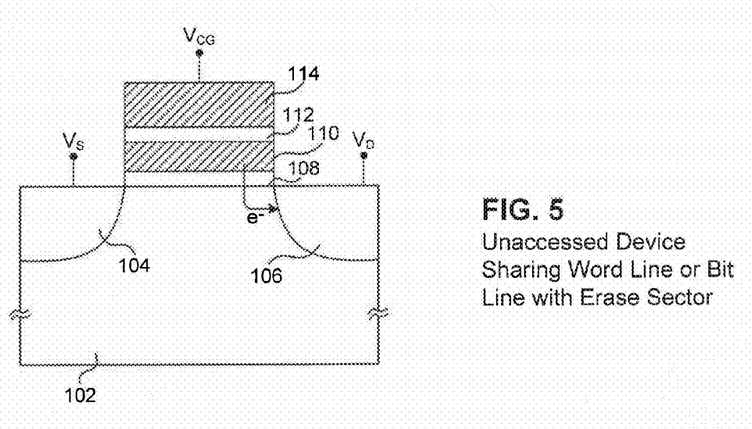
FIG. 5 shows the structure of FIG. 1 during an erase operation in an adjacent memory area that has a word line or a bit line in common with the illustrated transistor in which electrons tunnel from the floating gate as an unintended consequence of the erase operation in the adjacent memory area, in a process referred to as word line, or bit line disturb.

FIG. 5 shows the structure of FIG. 1 during an erase operation in an adjacent memory area that has a word line or a bit line in common with the illustrated transistor in which electrons tunnel from the floating gate as an unintentional consequence of the erase operation in the adjacent memory area, in a process referred to as word line, or bit line disturb. In this context, "adjacent memory area" refers to a section of the memory that shares at least one word line or at least one bit line with the section of memory that is the target of the erase operation.

Figure 6:
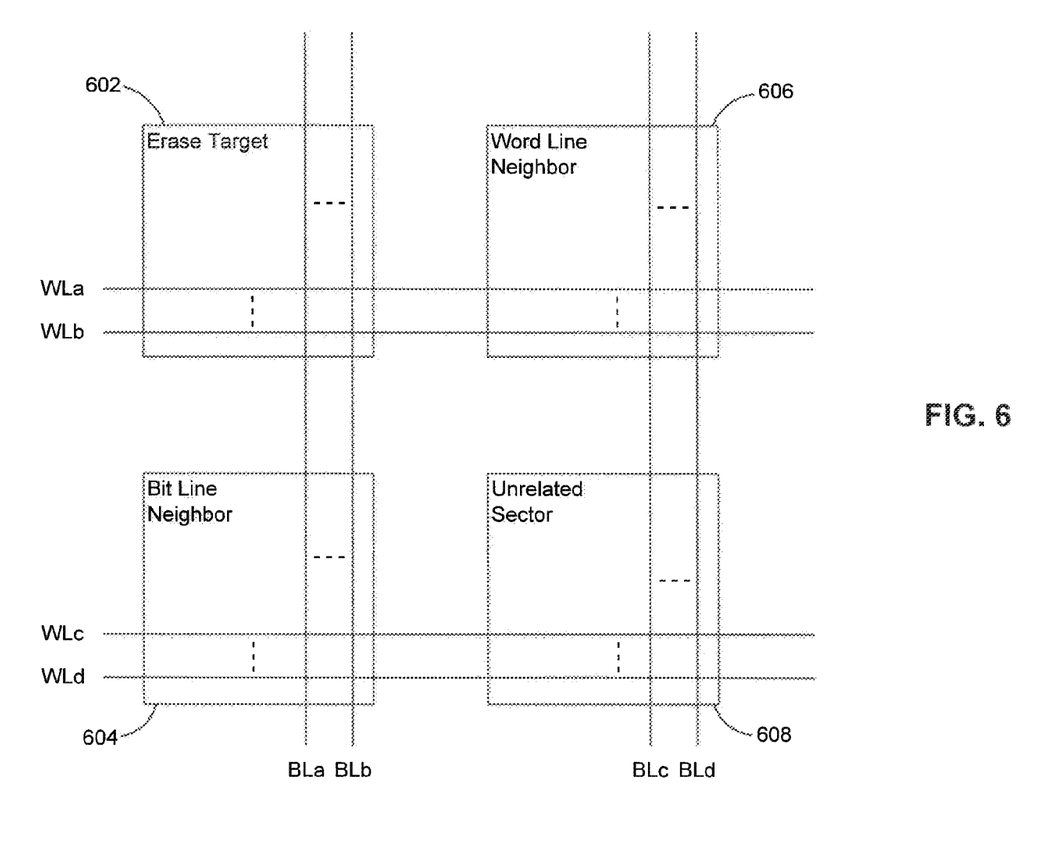
FIG. 6 is a schematic representation of a portion of a flash memory showing a target erase section, a section that shares word-lines with the target erase section (a word-line neighbor), a section that shares bit-lines with the target erase section (a bit-line neighbor), and an unrelated section of memory cells.

FIG. 6 is a schematic representation of a portion of a flash memory 600 showing a target erase section 602, a section 606 that shares word-lines with target erase section 602 (referred to as a word-line neighbor), a section 604 that shares bit-lines with target erase section 602 (referred to as a bit-line neighbor), and a section 608 that does not share word-lines or bit-lines with target erase section 602 (referred to as an unrelated neighbor).

Still referring to FIG. 6, in an illustrative erase operation, the word-lines and bit-lines of erase target section 602 are set to the appropriate voltages so that electrons leave the floating gates by tunneling through the respective floating gate dielectric layers. Only the memory cells in erase target section 602 are intended to be erased. In an exemplary arrangement, bit-line neighbor 604, which shares bit-lines with target erase section 602, is exposed to the relatively high bit line voltage used during the erasing of section 602. In erasing the voltage differential between the control gate of a memory cell and a bit line of the memory cell is increased to produce electron tunneling from the floating gate to the bit-line (i.e., drain). Although the voltage differential between the control gate of memory cells in bit-line neighbor section 604 and the shared bit-lines is not as great as that experienced in erase target section 602, it is great enough to create a disturb condition that over repeated occurrences leads to read disturb errors. To overcome this problem it is necessary to refresh the potentially charge degraded memory cells. The disturb resulting from any one erase operation is small as compared to the level of disturb needed to cause a read error, generally requiring thousands of erase operations to cause a read error. It is therefore not necessary to refresh potentially disturbed memory cells after each erase operation. It is only necessary to refresh each potentially affected memory cell once before the number of erase cycles begins to approach the disturb level that could create a read error. This allows the refresh operation to be done on one small group of potentially affected memory cells following each erase operation and moving to a new group of memory cells for each erase operation such that the refresh work on the entire memory cell array is distributed across many erase cycles. This reduces the time and energy spent on refresh related to each erase operation so as to not significantly increase the duration or power consumption of each individual erase operation.

Illustrative Embodiment

Several illustrative embodiments are presented below and described in the context of a 16 Mb flash memory array that is divided into eight Big Blocks, with each Big Block having four blocks, and each block having sixteen sectors.

Figure 7:
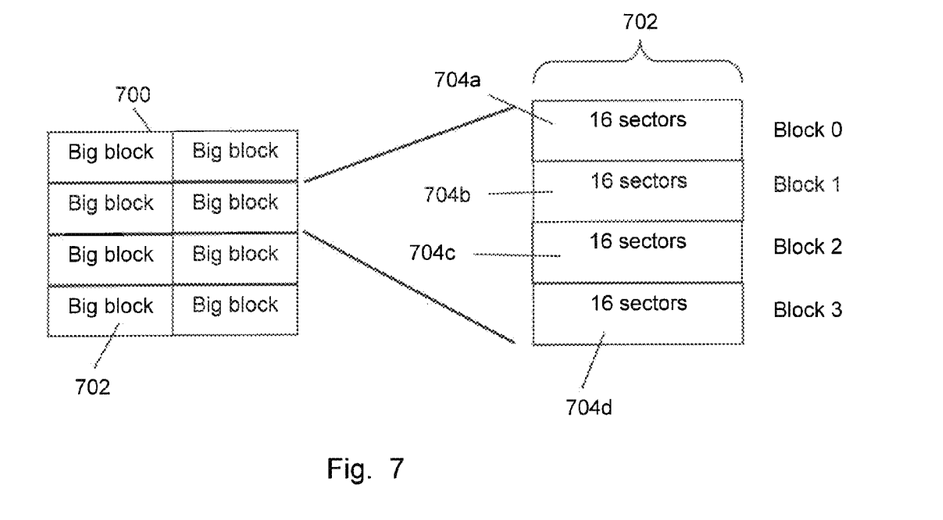
FIG. 7 shows a logical representation of an exemplary flash memory array that includes a plurality of big blocks, each big block including four blocks, and each block including sixteen sectors.

FIG. 7 is a high-level block diagram showing an illustrative flash memory array 700 logically organized as a collection of eight "big blocks" 702. Each big block 702 is shown to be organized as a collection of four blocks 704a, 704b, 704c, 704d. Each of blocks 704a, 704b, 704c, 704d is logically organized as 16 sectors. Each of blocks 704a, 704b, 704c, 704d may be referred to, respectively, as Block 0, Block 1, Block 2 and Block 3. In this illustrative embodiment, a common local bitline is shared in the big block, and the big block is thus susceptible to disturb errors. The present invention is not limited to any particular logical arrangement or physical grouping of memory cells.

Figure 8:
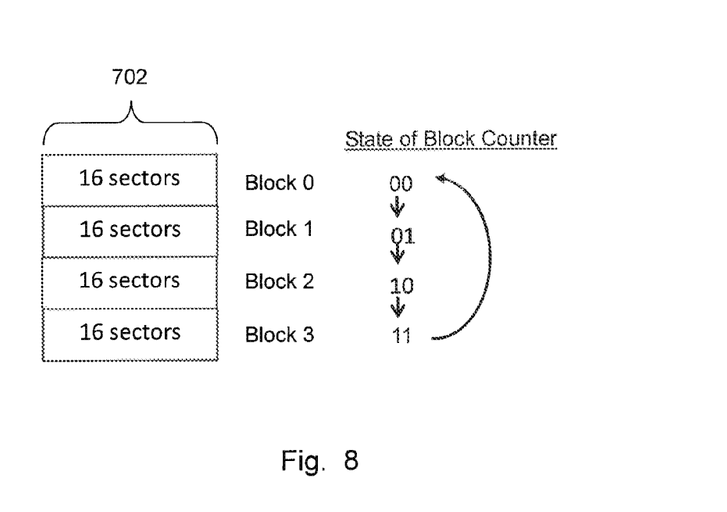
FIG. 8 shows a logical representation of a one big block that includes four blocks, each block having sixteen sectors, and further showing the state of a block counter associated with a refresh operation of each of the blocks in the big block.

FIG. 8 shows a single big block 702, and its four constituent blocks, Block 0, Block 1, Block 2 and Block 3. Further shown, adjacent to each of Block 0, Block 1, Block 2 and Block 3 is a unique state of a block counter (not shown) The arrows in FIG. 8 indicate that, in this illustrative embodiment, the state of the block counter transitions through the following states: 00, 01, 10, 11, and then back to state 00. Various embodiments use the state of the block counter to specify which block is to be refreshed. The present invention is not limited to any particular implementation of the block counter. In various illustrative embodiments the block counter may change state by incrementing, decrementing, shifting its contents, acting as a polynomial counter, being loaded with a value from other circuitry including but not limited to a micro-controller, or any other suitable means of changing state.

Figure 9:
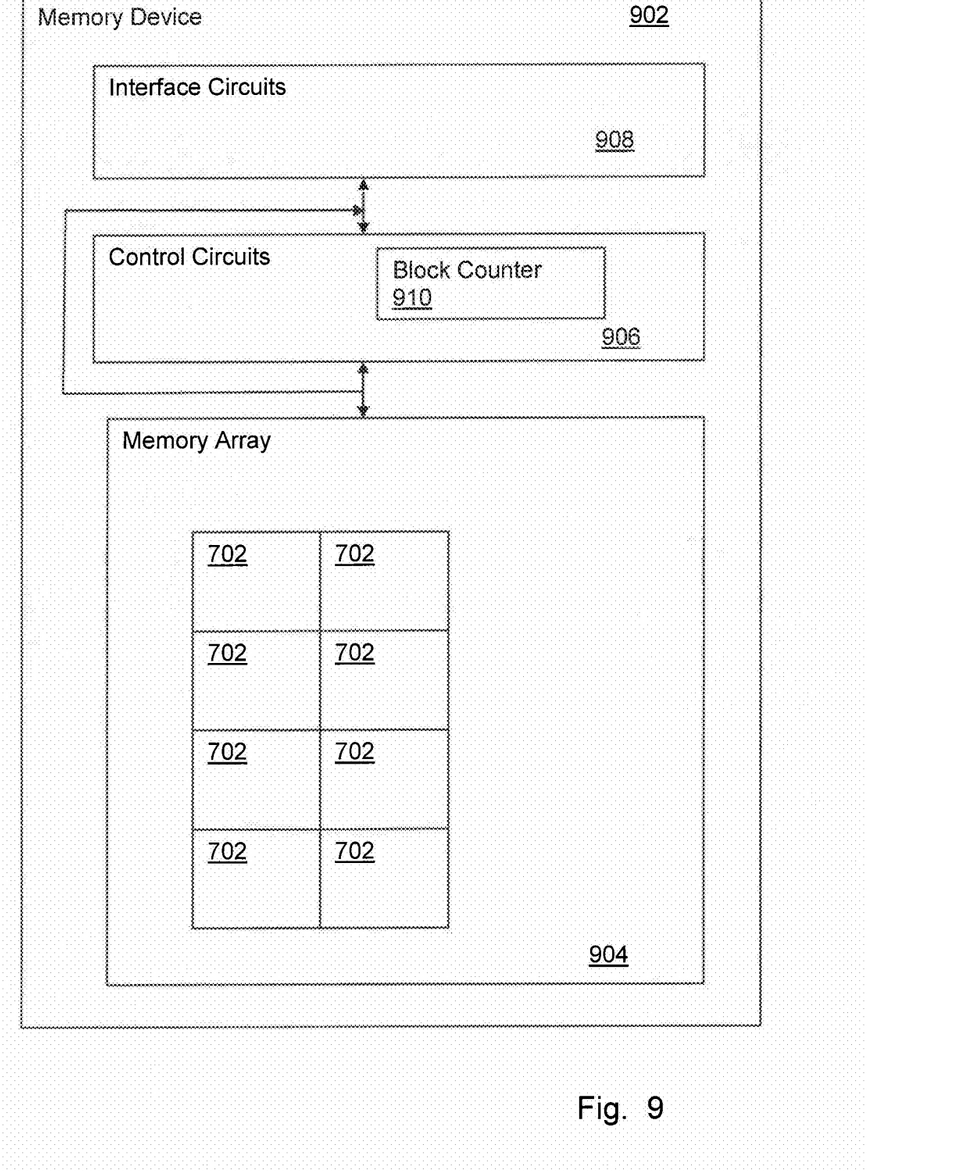
FIG. 9 is a high-level block diagram of an exemplary flash memory device.

FIG. 9 is a high-level block diagram of an illustrative flash memory device 902. Flash memory device 902 includes a memory array, which in turn includes a plurality of big blocks 702; control circuits 906; and interface circuits 908. Memory array 902 is coupled to both control circuits 906 and interface circuits 908; and control circuits 906 are further coupled to interface circuits 908. Memory array 902 typically includes well-known row and column address decoding circuitry (not shown). Control circuits 906 includes the circuitry necessary to perform the various operations of memory device 902 such as the well-known erase, program, and read operations. Typical embodiments include a microcontroller that operates responsive to stored instructions. Such microcontrollers within flash memory devices are used to control various operations that often include many steps. Control circuits 906, further include a block counter 910. Interface circuits 908 include the circuitry necessary to perform the various well-known input/output buffering of such flash memory devices.

Process

Various embodiments of the present invention distribute refresh time over many erase operations so that the refresh time for any one erase is small compared to the brute force method of refreshing an entire big block responsive to every erase operation. In some embodiments, the erase process includes both a pre-programming operation and an erase operation.

Various embodiments use sequential logic or a microcontroller embedded with a flash memory device to execute the refresh algorithm every time the erase procedure is done. In some embodiments the refresh procedure is part of the same sequential logic operation or microcontroller program routine as the erase procedure.

Increased benefits from the present invention occur as the big block is divided into smaller refresh units. Refresh unit refers to that portion of the memory that is refreshed during the refresh cycle initiated in response to an erase cycle. The smaller the refresh unit becomes, the shorter is the refresh time that is added to each erase/refresh cycle pair. For example, an individual word line could be refreshed.

It is noted that one design consideration in implementing various embodiments is the ratio of refresh units to the program/erase cycle limit of the memory device without refresh. Without performing refresh operations it is known that enough disturb will accumulate within the program/erase cycle limit of the memory device to cause read errors in sectors that have not been erased/refreshed. As long as the number of refresh units (e.g., word lines in a big block) are low enough in relation to the program/erase cycle limit, eventually all refresh units will be refreshed before reaching the program/erase cycle limit, thereby resetting the limit on the shared bit line disturb effect.

There are various ways of selecting which refresh unit to perform the refresh upon, following each erase operation. When the ratio of refresh units, in a big block, to the program/erase cycle limit of the memory device is low, e.g., 1/1000, the selection of the refresh unit can be random. This means there will be many more refresh operations than erase cycles allowed and the probability that all refresh units will be refreshed, via random selection, before the erase cycle limit is reached, is very near 100%. It is noted that there is no need to refresh within the sector just erased. So, if the selected refresh unit is in the just erased sector, the refresh operation can either be skipped or directed to another refresh unit. Also, it is only necessary to refresh within the big block where a sector is erased.

One method for selecting refresh units is to provide one counter with a count range equal to the number of refresh units in a big block. The present invention is not limited to any particular number of refresh units per big block. The counter can be incremented following each erase operation to any big block in the device. If all erase operations are directed to one big block, then the refresh units will be refreshed in sequence. If erase operations are distributed among big blocks, then the refresh unit selection will become more random with respect to any one big block. Thus effectively moving randomly through refresh units in all big blocks because erases tend to occur in different big blocks.

However, the ratio of refresh units to program/erase cycle limit cycles can be lowered by increasing the certainty that all refresh units are covered within the program/erase cycle limit. This may be achieved by providing a counter for each big block, or by adding a bit in each refresh unit that can be programmed to mark it as refreshed. Either method ensures linear progress through the refresh units by tracking within each block rather than relying on a single counter per memory device that is incremented by any erase.

In the illustrative embodiment of FIG. 8, the state of a two-bit binary counter is shown. In this embodiment the counter increments by 1 after each refresh. Those skilled in the art and having the benefit of the present disclosure will understand that any suitable means or apparatus for producing the required number of unique states can be used. By way of example and not limitation, the block counter may be a binary counter of three or more bits which resets to a beginning state after counting through an adequate number of unique states. In some embodiments the binary counter counts up, counts down, or counts up and then down, or down and then up. In another embodiment the block counter is a polynomial counter rather than a binary counter. In another embodiment, the block counter is a storage register whose contents are loaded from the output of other circuitry, for example, an on-chip microcontroller.

It is noted that the block counter may alternatively be referred to as a counter, a refresh counter, a block pointer, a refresh pointer, a pointer, a block refresh address register, a refresh address register, and similar terms or expressions. No limitation is intended by the choice of terminology for this functionality. The functional requirement of this illustrative embodiment is that a block counter be able transition through an adequate number of states such that all of the subsections of the memory are eventually refreshed. Any suitable implementation of the refresh counter functionality may be used, including but not limited to a binary counter, a polynomial counter, a shift register, a loadable non-counting register, a micro-controller.

The state of the block counter indicates which one block "n" to refresh after an erase operation. In this embodiment the block to be refreshed is within the same big block as the erased sector, the counter increments by 1, and wraps from state 11 to state 00 (as shown in FIG. 8). In this way four erase operations (either sector erase or block erase) in a big block will result in the entire big block being refreshed. This is because, in this illustrative embodiment, a block refresh in a big block is performed every time a sector or block in the big block is erased.

The present invention is not limited to the 16 sectors/block and 4 blocks/big block of the illustrative embodiments described above. Some memory devices may have more or fewer sectors per block, and/or more or fewer blocks per big block. However, embodiments of the present invention provide an adequate number of refreshes such that data integrity is maintained in the memory cells by refreshing the entire array, block by block, before the critical number of program/erase cycles for that memory array has occurred.

In some embodiments, every erase operation, anywhere in the memory device, increments a single block counter in the device, which helps to randomize the location of refresh in any particular big block. Such a configuration helps to avoid the situation where the power cycles (i.e., power on/power off) occur more frequently than erase commands thus always resetting the block counter to zero, or some known state, before all four blocks are refreshed. In alternative embodiments, the block counter is not reset by power cycles but rather powers up in a random state. In further alternative embodiments, the block counter is loaded with a random seed value upon a power on reset sequence.

Figure 10:
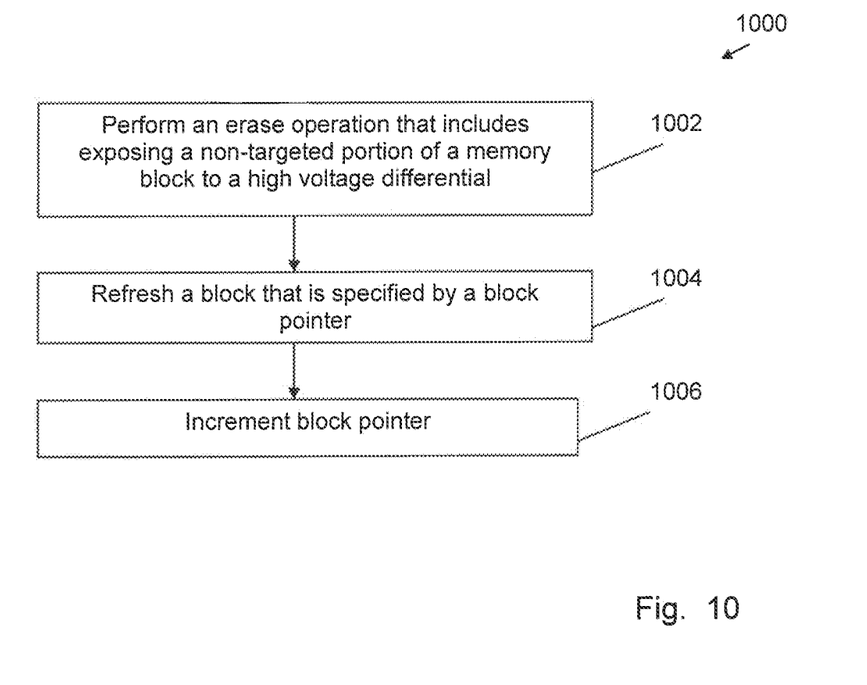
FIG. 10 is a flow diagram of an exemplary process in accordance with the present invention.

FIG. 10 shows a flow diagram of a process 1000 in accordance with the present invention. At a step 1002 an erase operation is performed that includes exposing a non-targeted portion of a memory block to a voltage differential large enough to potentially accelerate data decay (i.e., a disturb condition). In this illustrative embodiment, the erase operation is performed responsive to the receipt of an erase command, but the invention is not so limited. The erase operation may be directed to a sector or to a block, but the invention is not limited to erasing any particular number of memory cells. Moreover, references to an erase operation also comprehend pre-programming and post-erase operations, since any or all of these operations can lead to disturb errors. At a step 1004 a refresh operation is performed in which a block specified by a block pointer is performed. At a step 1006 the block pointer is incremented such that it specifies the next block to be refreshed responsive to an erase operation.

Figure 11:
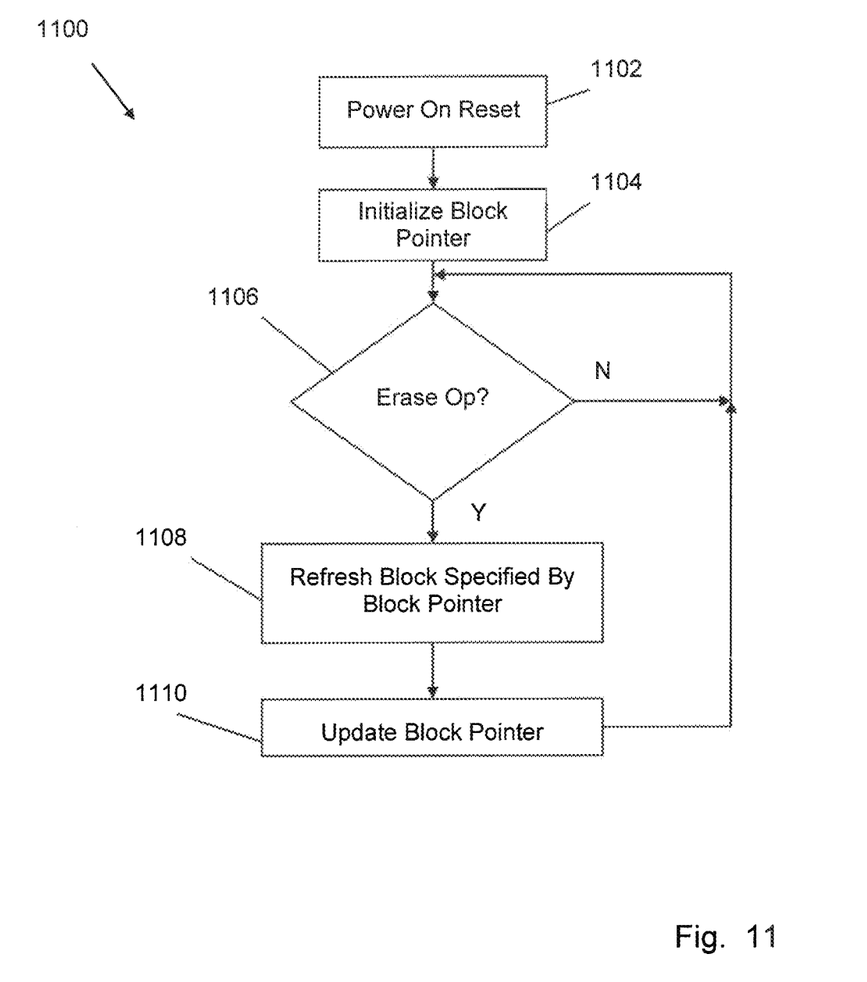
FIG. 11 is a flow diagram of another exemplary process in accordance with the present invention.

FIG. 11 shows a flow diagram of a process 1100 in accordance with the present invention. At a step 1102 a power-on reset is shown as the beginning of process 1100. At a step 1104 a block pointer is initialized. In this illustrative embodiment, the block pointer is a 2-bit binary counter that is reset to zero. At a step 1106 if no erase operation has been performed then control remains at step 1106. If an erase operation has been performed then at a step 1108 a refresh operation is performed on a block specified by the block pointer. At a step 1110 the block pointer is updated to a new state. The new state of the block pointer specifies the next block to be refreshed.

With respect to the embodiment illustrated in FIG. 11, it is noted that alternative embodiments may not require that the block pointer be reset after a power-on reset, or after any other reset sequence. Alternative embodiments may increment the block pointer prior to performing the block refresh operation rather than afterwards. It is further noted that the present invention is not limited to refreshing any particular number of memory cells during a refresh operation. Further, embodiments may refresh one or more bits concurrently during a refresh operation.

Flash memory devices are known in this field that are responsive to both a sector erase command and to a block erase command. Various embodiments of the present invention may respond to the sector erase command and the block erase command in the same way. Still other embodiments may respond differently in order to provide greater efficiency. For example, in the case of a block erase, the entire block is erased rather than one sector, thus there are no other sectors in the block that need to be refreshed. If the block pointer specifies refresh of the block that has just been erased then in some embodiments the refresh operation can be skipped, while in other embodiments the pointer is incremented first so that it points to a block other than the one that was just erased.

In some embodiments refresh activity in one block takes place concurrently with erase activity in another block. One constraint on such embodiments is the total current draw on the charge pumps used in a flash memory device. However, if a flash memory device design includes charge pumps robust enough to provide the required amount of current, and further includes separate microcontroller code threads to manage the concurrent operations it would be possible. It is noted that the erase operation would put some disturb on the other blocks so, the timing of read verify in the refresh block would have to be managed taking the erase timing into account.

In some embodiments the refresh activity begins with the decoding of the erase command. In some embodiments the erase operation begins first and the refresh activity begins before the erase operation is complete.

It is noted that various embodiments may be used to provide refreshing of the data in the memory cells regardless of the electrical conditions that have caused a degradation in the memory cell's pre-disturbed charge state.

It is noted that various embodiments may perform an erase operation rather than a program operation to accomplish the desired data refresh operation.

CONCLUSION

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A method of distributing across multiple erase operations, refreshing of content of plurality of groups of non-volatile memory cells in an integrated circuit, comprising:
   providing one pointer, the one pointer associated with each of the plurality of groups of non-volatile memory cells;
   detecting an erase operation directed to a first group of the plurality of groups of the non-volatile memory cells;
   refreshing a second group of the plurality of groups of the non-volatile memory cells, the second group of the plurality of groups specified by a first state of the one pointer; and
   operating the one pointer such that the one pointer has a second state;
   wherein the second group of the plurality of groups of the non-volatile memory cells is less than all of the plurality of groups of the non-volatile memory cells.

2. The method of claim 1, wherein detecting the erase operation comprises:
   detecting a receipt of an erase command at the integrated circuit.

3. The method of claim 1, wherein detecting the erase operation comprises;
   detecting an occurrence of an erase command at the integrated circuit.

4. The method of claim 1, further comprising:
   performing a pre-programming operation prior to an erase operation.

5. The method of claim 4, wherein refreshing occurs concurrently with the erase operation.

6. The method of claim 4, wherein refreshing occurs subsequent to the erase operation.

7. The method of claim 4, wherein the erase operation is a block erase, and the one pointer specifies refreshing an erased block, and further comprising:
   skipping the refresh operation.

8. The method of claim 4, wherein the erase operation is a block erase, and the one pointer specifies refreshing an erased block, and further comprising:
   incrementing the pointer and subsequently refreshing a block specified by the pointer.

9. A method of refreshing the content of an array of non-volatile memory cells, the array organized to have a plurality of blocks, and each block having a plurality of sectors, comprising:
   (a) providing a single block counter, the single block counter associated with each one of the plurality of blocks;
   (b) erasing a sector of non-volatile memory cells in a first block of the plurality of blocks;
   (c) refreshing a second block of the plurality of blocks where the block that is refreshed is selected based, at least in part, on a state of the single block counter associated with each one of the plurality of blocks; and
   (d) changing the state of the single block counter associated with each one of the plurality of blocks.

10. The method of claim 9, further comprising:
    repeating steps (b) through (d).

11. The method of claim 10, further comprising:
    initializing the state of the block counter.

12. The method of claim 10, wherein the array of non-volatile memory cells is included in an integrated circuit and further comprising:
    controlling the erasing and the refreshing by executing a program by a microcontroller embedded in the integrated circuit.

13. The method of claim 10, wherein erasing occurs prior to refreshing, and a pre-programming operation occurs prior to the erase operation.

14. The method of claim 10, wherein erasing occurs concurrently with refreshing.

15. The method of claim 10, wherein changing the state of the block counter comprises:
    incrementing the contents of the block counter.

16. The method of claim 10, wherein changing the state of the block counter comprises:
    shifting the contents of the block counter.

17. A non-transitory computer-readable storage medium having instructions stored thereon that, when executed by a microcontroller embedded in a non-volatile memory integrated circuit including a block counter, and an array of non-volatile memory cells, the array of non-volatile memory cells organized to have a plurality of blocks, each block of the plurality of blocks having a plurality of sectors, and the block counter being associated with each block of the plurality of blocks, causes the microcontroller to perform operations comprising:
    (a) erasing a portion of the non-volatile memory cells;
    (b) refreshing one block of the plurality of blocks where the one block is selected based, at least in part, on a state of the block counter; and
    (c) changing the state of the block counter; and
    (d) repeating steps (a) through (c).

18. The computer-readable storage medium of claim 17, wherein changing the state of the block counter comprises incrementing.

19. The computer-readable storage medium of claim 17, wherein changing the state of the block counter comprises shifting the contents of the block counter.

20. The computer-readable storage medium of claim 17, further comprising:
   (e) initializing the state of the block counter.

\* \* \* \* \*